United States Patent
Bacchus (10) Patent No.: US 11,232,848 B2
(45) Date of Patent: Jan. 25, 2022

(54) MEMORY MODULE ERROR TRACKING

(71) Applicant: HEWLETT PACKARD ENTERPRISE DEVELOPMENT LP, Houston, TX (US)

(72) Inventor: Reza M. Bacchus, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 154 days.

(21) Appl. No.: 15/540,491

(22) PCT Filed: Apr. 30, 2015

(86) PCT No.: PCT/US2015/028610
§ 371 (c)(1),
(2) Date: Jun. 28, 2017

(87) PCT Pub. No.: WO2016/175852
PCT Pub. Date: Nov. 3, 2016

(65) Prior Publication Data
US 2017/0372799 A1 Dec. 28, 2017

(51) Int. Cl.
| | | |
|---|---|---|
| *G11C 29/44* | (2006.01) | |
| *G11C 29/42* | (2006.01) | |
| *G11C 5/04* | (2006.01) | |
| *G11C 29/04* | (2006.01) | |

(52) U.S. Cl.
CPC .............. *G11C 29/44* (2013.01); *G11C 29/42* (2013.01); *G11C 5/04* (2013.01); *G11C 2029/0409* (2013.01); *G11C 2029/4402* (2013.01)

(58) Field of Classification Search
CPC .............. G06F 11/0793; G06F 11/073; G06F 11/0721; G06F 11/079; G11C 29/44; G11C 29/42; G11C 5/04; G11C 2029/4402
See application file for complete search history.

(56) References Cited

U.S. PATENT DOCUMENTS

| | | | |
|---|---|---|---|
| 6,101,614 A | 8/2000 | Gonzales et al. | |
| 6,604,177 B1 * | 8/2003 | Kondo | G06F 11/1641 |
| | | | 711/150 |
| 7,530,008 B2 | 5/2009 | Das et al. | |
| 8,392,797 B2 * | 3/2013 | Cheng | G06F 11/1068 |
| | | | 714/763 |
| 8,495,467 B1 | 7/2013 | Billing et al. | |

(Continued)

OTHER PUBLICATIONS

Gregori, S. et al., "On-Chip Error Correcting Techniques for New-Generation Flash Memories," (Research Paper), Proceedings of the IEEE, vol. 91, No. 4, Apr. 2003, 15 pages, http://ieeexplore.ieee.org/stamp/stamp.jsp?arnumber=1199087.

(Continued)

*Primary Examiner* — Jigar P Patel
(74) *Attorney, Agent, or Firm* — Hewlett Packard Enterprise Patent Department (57) ABSTRACT

In some examples, a memory module includes an error status indicator, an error address register, and error tracking circuitry. The error tracking circuitry may detect that memory data stored at a memory address for the memory module includes an error. In response, and without overwriting the memory data stored at the memory address, the error tracking circuitry may set the error status indicator and store the memory address in the error address register.

8 Claims, 8 Drawing Sheets

(56) References Cited

U.S. PATENT DOCUMENTS

| | | | |
|---|---|---|---|
| 8,683,298 B2* | 3/2014 | Reche | G06F 11/073 |
| | | | 714/6.13 |
| 2005/0018497 A1* | 1/2005 | Frankowsky | G11C 29/44 |
| | | | 365/200 |
| 2009/0172498 A1 | 7/2009 | Shlick et al. | |
| 2009/0327638 A1* | 12/2009 | Buch | G06F 11/073 |
| | | | 711/166 |
| 2010/0241899 A1* | 9/2010 | Mayer | G06F 11/0772 |
| | | | 714/10 |
| 2011/0041005 A1 | 2/2011 | Selinger | |
| 2011/0066903 A1* | 3/2011 | Foster, Sr. | G06F 1/206 |
| | | | 714/723 |
| 2013/0179751 A1 | 7/2013 | Linstadt | |
| 2014/0215291 A1* | 7/2014 | Wang | G06F 11/10 |
| | | | 714/773 |
| 2016/0148708 A1* | 5/2016 | Tuers | G11C 29/38 |
| | | | 714/719 |
| 2016/0224412 A1* | 8/2016 | Healy | G06F 11/0793 |
| 2016/0307645 A1* | 10/2016 | Kim | G11C 29/4401 |

OTHER PUBLICATIONS

International Search Report & Written Opinion received in PCT Application No. PCT/US2015/028610, dated Feb. 1, 2016, 14 pages.

\* cited by examiner

MEMORY MODULE ERROR TRACKING

BACKGROUND

With rapid advances in technology, computing systems are used in virtually all aspects of society today. Computing systems and devices are increasing in complexity and processing capability, and many include complex memory systems to store immense amounts of data. Increases in the efficiency and capability of computing and memory systems will result in further widespread use and adoption of technology in nearly every facet of life.

BRIEF DESCRIPTION OF THE DRAWINGS

Certain examples are described in the following detailed description and in reference to the drawings.

DETAILED DESCRIPTION

The disclosure below may provide features for error tracking of memory errors detected and corrected through on-memory module error correction. In-flight memory error correction by a memory module itself may allow the memory module to correct detected errors, for example after retrieving the memory data from a storage location (e.g., memory rank, bank group, bank, row and column address) of the memory module but prior to sending the memory data off module to a host system. In some examples, the memory module provides such error detection and correction through a die implemented on the memory module, thus providing on-die error correction. In some examples, the memory module may implement error detection and correction features on separate memory dies, and separate memory dies may thus provide error correction autonomously and transparent to a host system.

Tracking of detected memory errors may allow the memory module and the host system to prevent accumulation of uncorrected errors still stored in the memory module, which may allow the host system to predict and prevent system failures. As another feature, memory module error tracking may support determination of the nature, frequency, or other characteristics of memory error occurrences, allowing the host system to respond accordingly. The error tracking features disclosed below may further provide efficient mechanisms to retrieve the tracked error data from a memory module and support efficient correction of errant memory data stored on the memory module.

Figure 1:
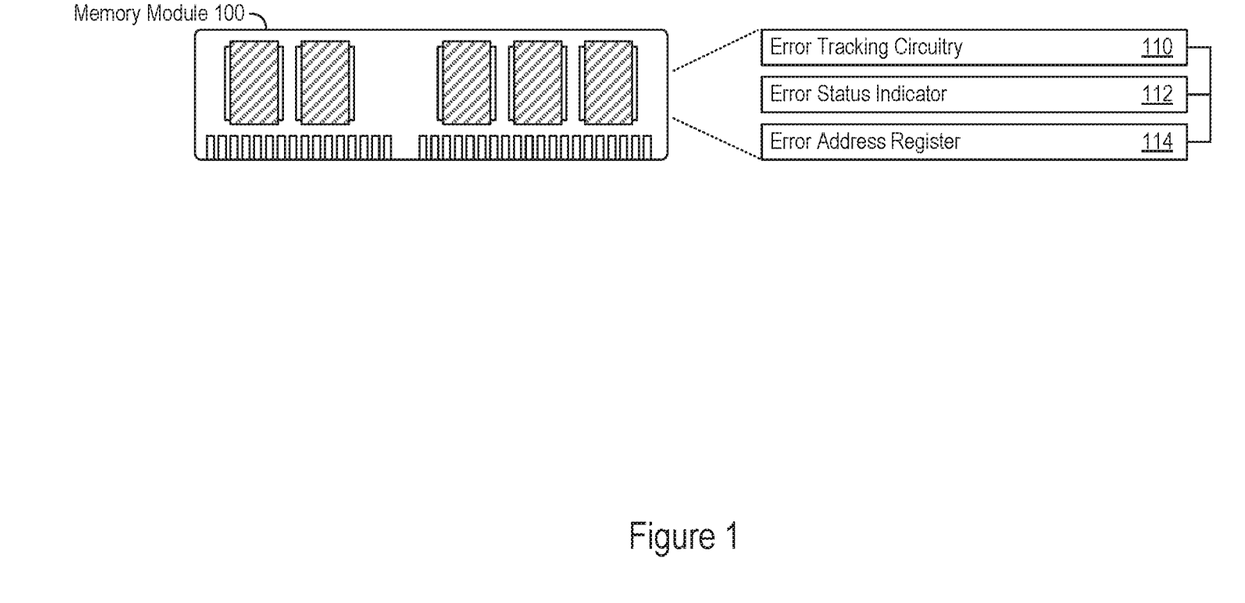
FIG. 1 shows an example of a memory module that supports error tracking.

FIG. 1 shows an example of a memory module 100 that supports error tracking. The memory module 100 may be any circuitry that implements a data storage medium, such as a dynamic random access memory (DRAM) integrated circuit (IC) implemented on a printed circuit board. The memory module 100 may be implemented, for example, as a single or multiple physical memory chips (e.g., multiple DRAM dies) on a common printed circuit board. In operation, the memory module 100 may provide a random access memory (RAM) for a host system, such as a desktop or laptop computer, workstation, application server, video gaming system, web host, or other computing devices and systems. The memory module 100 may thus include an interface to a host system, such as metal pins for control signal connections and communication buses to link to a host memory controller of the host system. The memory module 100 may take the form of any number of module types. FIG. 1 shows a particular example of the memory module 100 as a dual in-line memory module (DIMM). Other example module types the memory module 100 may take the form of include a single in-line memory module (SIMM), dual in-line package (DIP), single in-line pin package (SIPP), small outline DIMM (SO-DIMM), and more.

The memory module 100 may support on-module detection and correction of memory errors. That is, the memory module 100 itself may detect and correct a memory error for memory data stored in the memory module 100. The memory module 100 may do so prior to sending memory data off module to a host memory controller. Memory data stored on the memory module 100 that includes a memory error may be referred to as errant memory data. The memory module 100 may employ any combination of error detection and correction techniques to correct detected memory errors for retrieved memory data.

The memory module 100 may support on-module error detection and correction. In some examples, the on-module error detection and correction provided by the memory module 100 is implemented on a per-die basis. In that regard, a memory die (e.g., DRAM die) of the memory module 100 may implement on-die error correction capabilities as part of the die itself. Multiple dies on the memory module 100 may respectively provide on-die error correction capabilities for the memory data stored on the dies. On-module error correction by the memory module 100 (e.g., on-die error correction) may be transparent to a host memory controller linked to the memory module 100. To illustrate, a host memory controller receiving memory data from the memory module 100 may be unaware of whether a memory error was corrected for the memory data or not. The host memory controller may thus receive memory data from the memory module 100 for which detected memory errors have already been corrected by the memory module 100 (e.g., through on-die error correction).

In some examples, memory error correction by the memory module 100 is performed in-flight, e.g., in servicing a memory read request from the memory host controller. In these examples, the memory module 100 may detect a memory error after retrieving the errant memory data from a particular memory address and send corrected memory data to the host memory controller without overwriting the errant memory data stored in the memory module 100. Thus, the memory module 100 may process a memory read request by providing corrected memory data to a host memory controller without overwriting the errant memory data stored on the memory module 100 from which the corrected memory data was generated. In doing so, the memory module 100 may provide memory data with increased accuracy without degrading performance latency required to write back the corrected data to the particular memory address the errant memory data was retrieved from.

The memory module 100 may support tracking of detected memory errors for memory data stored on the memory module 100. In particular, the memory module 100 may track detected errors for errant memory data corrected in-flight, but still stored on the memory module 100. The error tracking features provided by the memory module 100 may compliment the on-module error correction capabilities of the memory module 100, allowing the memory module 100 or a host system to track error occurrences, adaptively respond based on the frequency and nature of the error occurrences, as well as prevent the accumulation of errant memory data stored on the memory module 100

To support error tracking, the memory module 100 may include error tracking circuitry 110. As described in greater detail below, the error tracking circuitry 110 may track when an error is detected for memory data stored on the memory module 100 as well as track the memory location that stores the memory data with the detected error, e.g., the memory address of the errant memory data from which the error was detected. The error tracking circuitry 110 may then provide the tracked error data to the host system, for example in response to an error inquiry message sent from a host memory controller of the host system.

The memory module 100 may include an error status indicator 112. The error status indicator 112 may indicate to a host memory controller that an error has been detected for the memory module 100, for example since a previous error inquiry by the host memory controller. The memory module 100 may implement the error status indicator 112 as, for example, a register, a particular bit, a flag, or any other data form to provide an error status indication. In some examples, the error status indicator 112 may indicate one of multiple states, such as a set state and a cleared state. The error tracking circuitry 110 may set the error status indicator 112 to the set state upon detecting a memory error for memory data stored on the memory module and clear the error status indicator 112 after providing memory error data to the host memory controller.

The memory module 100 shown in FIG. 1 also includes the error address register 114. The error tracking circuitry 110 may track a memory address for which a memory error has been detected through the error address register 114. In that regard, the error address register 114 may track a particular memory address storing errant memory data. For example, in response to detecting that memory data stored at a memory address for the memory module 100 includes an error, the error tracking circuitry 110 may store the memory address in the error address register 114. The error tracking circuitry 110 may do so without overwriting the memory data stored at the memory address, and may thus maintain the performance efficiencies of in-flight error correction by the memory module 100. Although one error address register 114 is shown in FIG. 1, the memory module 100 may implement any number of error address registers, for example 8 or 16. In some examples, the error tracking circuitry 110, error status indicator 112, and error address registers are implemented as part of memory dies on the memory module 100, e.g., on a per-die basis.

Figure 2:
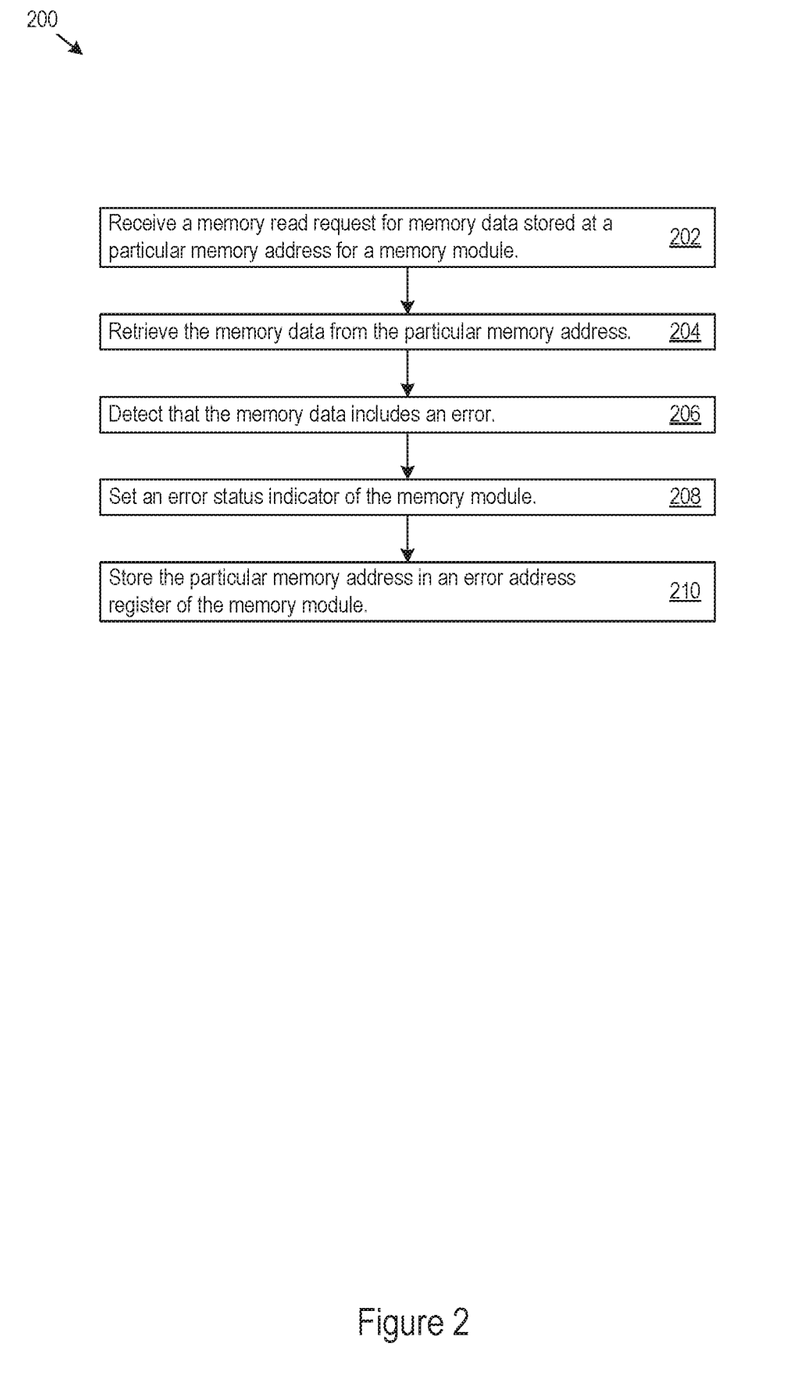
FIG. 2 shows an example of logic that a memory module may implement to support error tracking.
Figure 3:
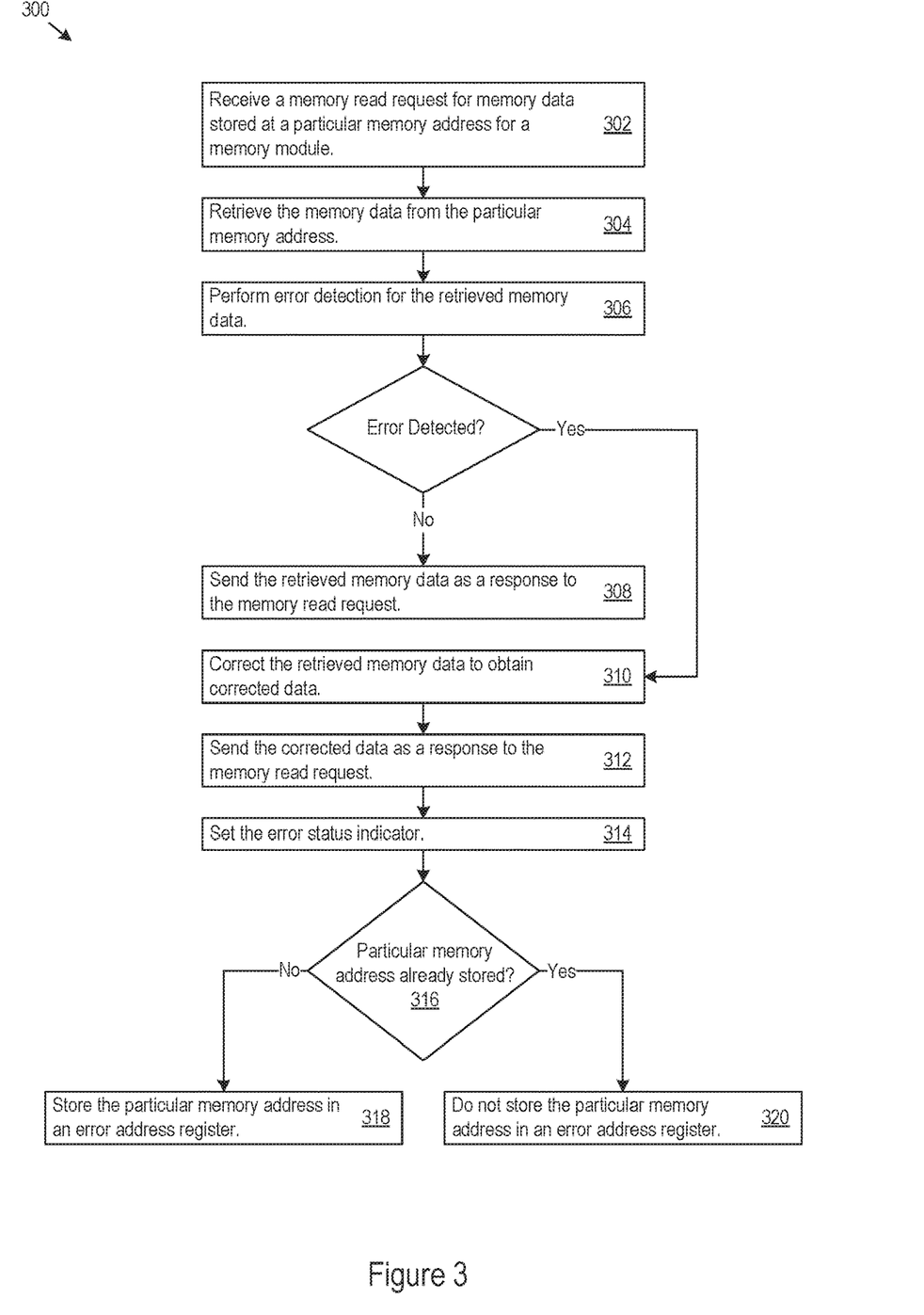
FIG. 3 shows another example of logic that a memory module may implement to support error tracking.
Figure 4:
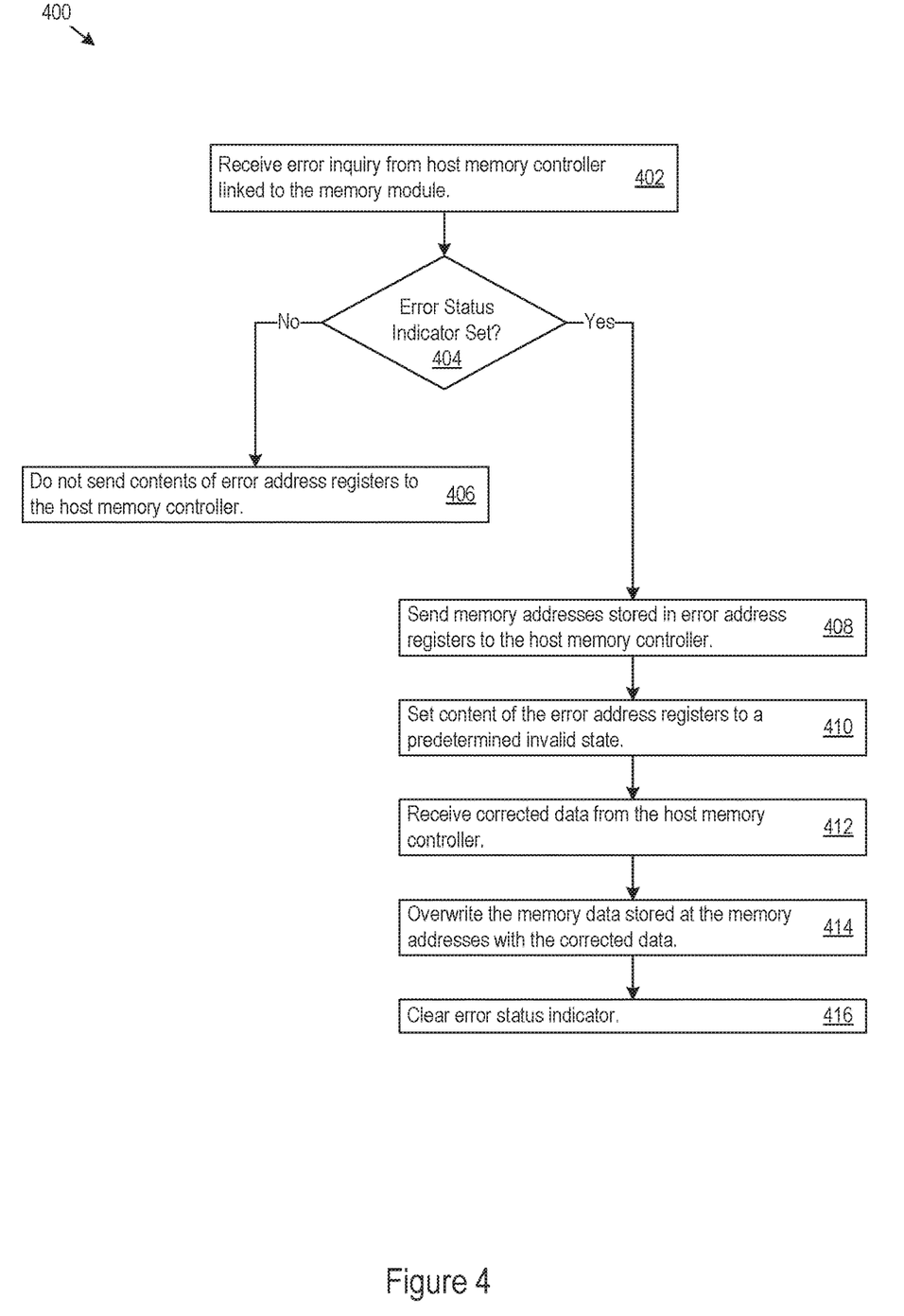
FIG. 4 shows another example of logic that a memory module may implement to support error tracking.

Some example features through which the error tracking circuitry 110 may support error tracking are described through FIGS. 2-4. FIGS. 2 and 3 describe features through which the error tracking circuitry 110 may track detected memory errors, such as by setting the error status indicator and storing a particular memory address in an error address register. FIG. 4 describes features through which the error tracking circuitry 110 may communicate tracked error occurrences to a host memory controller. These features of the error tracking circuitry 110 are described next.

FIG. 2 shows an example of logic 200 that a memory module may implement to support error tracking. A memory module may implement the logic 200 through, for example, error tracking circuitry 110 of the memory module. The error tracking circuitry 110 may perform or execute the logic 200 as a method to support error tracking for a memory module.

The error tracking circuitry 110 may receive a memory read request for memory data stored at a particular memory address for a memory module (202). For instance, the error tracking circuitry 110 may receive the memory read request from a host memory controller of a host system. To service the memory read request, the error tracking circuitry 110 may retrieve the memory data from the particular memory address (204).

In some examples, the error tracking circuitry 110 may implement error detection and correction features, thus providing on-module error detection and correction capabilities for the memory module. As such, the error tracking circuitry 110 may detect that the retrieved memory data includes an error (206). A memory error detected by the error tracking circuitry 110 may include any inaccuracy in the memory data, such as a single bit error or multiple bit errors. The memory error may thus include memory errors detectable (and possibly correctable) through various ECC techniques, single error correction double error detection (SECDED) hamming code, triple modular redundancy codes, parity, or various other error detection and correction mechanisms. The error tracking circuitry 110 may detect that the memory data includes an error according to any of the various error detection mechanisms noted above. The error tracking circuitry 110 may correct the error in the memory data using any of these techniques as well.

Upon detecting an error for memory data in the memory module, the error tracking circuitry 110 may provide an indication of the memory error detection and track the memory location on the memory module from where the errant memory data was retrieved from. Accordingly, in response to detecting that the memory data includes an error and without overwriting the memory data stored at the particular memory address, the error tracking circuitry 110 may set the error status indicator of the memory module (208) and store the particular memory address in an error address register of the memory module (210). The tracked memory address may indicate the location of the errant memory data on the memory module, which the error tracking circuitry 110 may later provide to a host system as tracked error data. Thus, the error tracking circuitry 110 may track in-flight errors corrected through on-module ECC (e.g., on-die ECC) including the memory locations of errant memory data from which memory errors have been detected.

FIG. 3 shows another example of logic 300 that a memory module 100 may implement to support error tracking, for example through the error tracking circuitry 110. The error tracking circuitry 110 may perform or execute the logic 300 as a method to support error tracking for a memory module.

In the example logic 300 shown in FIG. 3, the error tracking circuitry 110 may receive a memory read request for memory data stored at a particular memory address for the memory module (302). To service the memory read request, the error tracking circuitry 110 may retrieve the memory data from the particular memory address of the memory module (304). Then, the error tracking circuitry 110 may perform an error detection process for the retrieved memory data (306), which may allow the error tracking circuitry 110 to determine whether a correctable error is present in the retrieved memory data or not. The error tracking circuitry 110 may employ any of the ECC techniques noted above to detect a memory error in the retrieved memory data. When an error is not detected for the retrieved memory data, the error tracking circuitry 110 may send the retrieved memory data (or a specific portion thereof) as a response to the memory read request (308).

When the error tracking circuitry 110 detects a memory error for the retrieved memory data, the error tracking circuitry 110 may perform an in-flight error correction for the retrieved memory data. In doing so, the error tracking circuitry 110 may correct the retrieved memory data to obtain corrected data (310), such as through any of the error correction techniques noted above. Then, the error tracking circuitry 110 may send the corrected data as the response to the memory read request (312). By performing an in-flight correction of the retrieved memory data, the error tracking circuitry 110 may increase the accuracy of memory data sent to the host memory controller without increasing processing latency by rewriting the corrected memory data back to the particular memory address. Thus, even after the in-flight on-module correction, the particular memory address of the memory module may continue to store errant memory data.

The error tracking circuitry 110 may track errant memory data stored on the memory module that has been corrected in-flight. To do so, the error tracking circuitry 110 may set an error status indicator for the memory module (314), which may thus indicate to a host memory controller that a memory error for memory data stored on the memory module has been detected. For example, the error tracking circuitry 110 may set the error status indicator for a particular memory die storing the errant memory data. When the error status indicator has already been set (e.g., from a previous in-flight error detection), the error tracking circuitry 110 may not set the error status indicator again. The error tracking circuitry 110 may also track the particular memory address from which the errant memory data was retrieved from through error address registers of the memory module, e.g., the error address registers for a particular memory die storing the errant memory data.

The error tracking circuitry 110 need not track every memory address for which a memory error is detected, though the error tracking circuitry 110 may. In some examples, a memory module may limit or control which particular memory addresses with detected memory errors are stored in the error address registers of the memory module. The number of error address registers implemented by the memory module, for example, may limit the number of memory addresses storing errant memory data that the error tracking circuitry 110 can track at a particular point in time. Thus, the memory module may flexibly support increased amounts of error tracking by providing a greater number of error address registers or reduce the chip area used and provide reduced resource consumption through a lesser number of error address registers.

Continuing the discussion of how the error tracking circuitry 110 may control whether a memory address storing errant memory data is stored in error address registers of the memory module or not, the error tracking circuitry 110 may prevent multiple error address registers in the memory module from storing the same memory address. To illustrate through the example shown in FIG. 3, the error tracking circuitry 110 may determine whether a particular memory address from which errant memory data was retrieved is already stored among error address registers of the memory module (316). If not, the error tracking circuitry 110 may store the particular memory address in an error address register (318). If already stored, the error tracking circuitry 110 may not store the particular memory address in an error address register (320). In other examples, the error tracking circuitry 110 may allow for duplicate address entries among error address registers, such as by storing the particular memory address in an error address register even when the particular memory address is already stored in another error address register of the memory module.

As another example, the error tracking circuitry 110 may control whether to overwrite the contents of an error address register already storing valid memory address data. The error tracking circuitry 110 may determine not to store a particular memory address for which a memory error was detected when the error address registers of the memory module are full, e.g., when each error address register respectively stores a valid memory address for the memory module. Thus, once the error address registers of the memory module are populated with valid memory address data for detected errors, the error tracking circuitry 110 may elect to not track the memory locations of subsequently detected errors. In other examples, the error tracking circuitry 110 may overwrite the contents of an error address register with the particular memory address for a detected error even when the error address registers of the memory module are full. The error tracking circuitry 110 may determine which particular error address register to overwrite with the particular memory address in any number of ways, such as through a least recently used register, most recently used, in a round-robin fashion, randomly, or according to any other error address register selection criteria.

In some examples, the error tracking circuitry 110 may implement a counter, e.g., such as a digital counter as part of an error address register of the memory module. Thus, error address registers of the memory module may include a digital counter. When the error tracking circuitry 110 subsequently an detects error at an address location that is already populated in a particular error address register (e.g., a new error), the error tracking circuitry 10 may increment the counter for that particular error address register. The counter may be constructed with any number of counting bits, e.g., 4 or 5. The counter may also include an overflow bit. The overflow bit may be automatically set when the counter reaches and exceeds its maximum count capability, for example. The error tracking circuitry 110 may thus increment the counter when the error address register stores the memory address and upon a subsequent detection of a memory error for a particular memory address.

As described above, the error tracking circuitry 110 may track the memory locations of errant memory data stored on a memory module through the error address registers. As the error tracking circuitry 110 detects memory errors, the error address registers of the memory module may be populated with these memory error locations. Eventually, the error tracking circuitry 110 may provide the contents of the error address registers to a host system. An example of how the error tracking circuitry 110 may do so is presented next in FIG. 4.

FIG. 4 shows another example of logic 400 that the memory module 100 may implement to support error tracking, for example through the error tracking circuitry 110. The error tracking circuitry 110 may perform or execute the logic 400 as a method to support error tracking for a memory module.

The error tracking circuitry 110 may receive an error inquiry from a host memory controller linked to a memory module (402). The error inquiry may be a message sent from the host memory controller to poll for tracked error data collected by the memory module. The error tracking circuitry 110 determine whether the error status indicator is set or not (404). The memory module response to the error inquiry may depend on the state of an error status indicator maintained by the error tracking circuitry 110, as the error tracking circuitry 110 may set the error status indicator upon detecting a memory error for memory data stored on the memory module. In a set state, the error status indicator may indicate that the error tracking circuitry 110 has detected at least one memory error from retrieved memory data. In a cleared state, the error status indicator may indicate that the error tracking circuitry 110 has not detected an error for retrieved memory data since the error status indicator was last cleared.

When the error status indicator is not set (e.g., in a cleared state), the error tracking circuitry 110 may not send the contents of the error address registers of the memory module to the host memory controller (406). The error address registers of the memory module may not store valid memory address data when the error address indicator is not set, as the error status indicator in a cleared state may indicate the error tracking circuitry 110 has not detected an error for retrieved memory data (and thus has not stored any memory addresses in the error address registers). In that regard, the error address indicator may indicate when at least one of the error address register stores valid memory address data (e.g., when set) or when none of the error address registers stores valid memory address data (e.g., when cleared).

In some examples, the error tracking circuitry 110 responds to an error inquiry from the host memory controller with a response message. The response message may indicate whether a memory error has been detected. As such, the error tracking circuitry 110 may send the response message as an indicator of the state of the error status indicator. When the error status indicator is not set, the error tracking circuitry 110 may respond to the error inquiry with a response message indicating that no memory error has been detected. When the error status indicator is set, the error tracking circuitry 110 may respond to the error inquiry with a response message indicating that a memory error has been detected.

When the error status indicator is set, the error tracking circuitry 110 may send a memory address stored in an error address register to the host memory controller (408). For instance, the error tracking circuitry 110 may send the memory address stored in the error address register in response to an error address register read request from the host memory controller, which the error tracking circuitry 110 may receive after indicating to the host memory controller that a memory error has been detected. In some examples, the error tracking circuitry 110 automatically sends the memory address stored in the error address register in response to determining that the error status indicator is set, e.g., without receiving the error address register read request from the host memory controller.

In sending error address register contents to the host memory controller, the error tracking circuitry 110 may send the valid memory addresses stored among the error address register. Thus, the error tracking circuitry 110 may provide the host memory controller with the location(s) of errant memory data stored on the memory module. The host memory controller may use the memory addresses received the error tracking circuitry 110 to correct the errant memory data stored at the particular memory addresses, as described in greater detail below.

After providing the contents of the error status registers to the memory host controller, the error tracking circuitry 110 may clear the contents of the error address registers. For example, the error tracking circuitry 110 may set the contents of the error address registers to a predetermined invalid state (410). The error tracking circuitry 110 may identify a particular register value as an invalid value, and thus clear the error address registers by setting the contents of the error address registers to the invalid value.

By sending memory addresses of errant memory data stored on the memory module, the error tracking circuitry 110 may support subsequent correction of the errant memory data. For example, after sending the memory addresses stored in the error address registers to the host memory controller, the error tracking circuitry 110 may receive corrected data from the host memory controller (412) and overwrite the memory data stored at the sent memory addresses with the corrected data (414).

In some examples, the error tracking circuitry 110 itself provides the corrected data that the host memory controller provides back to the error tracking circuitry 110 to overwrite errant memory data. This process may be referred to as a read and write-back process by the host memory controller. To illustrate, the error tracking circuitry 110 may send a particular memory address stored in an error address register to the host memory controller in response to an error inquiry from the host memory controller. Subsequently, the error tracking circuitry 110 may receive a memory read request for the particular memory address from the host memory controller, retrieve the errant memory data from the particular memory address, perform an in-flight correction of the errant memory data to obtain corrected memory data, and send the corrected memory data to the host memory controller as a response to the memory read request. Then, the error tracking circuitry 110 may receive a memory write request from the host memory controller to write the corrected memory data (previously provided by the error tracking circuitry 110) to the particular memory address, thus writing back the corrected memory data to the particular memory address.

The error tracking circuitry 110 may clear the error status indicator (416), for example upon overwriting the memory addresses with corrected data received from the host memory controller. By clearing the error status indicator after a read and write-back process, the error tracking circuitry 110 may prevent the error status indicator from being set when handling the memory read request of the read and write-back process, which would include detecting and correcting a memory error for errant memory data. Were the error status indicator cleared prior to the read and write-back process, the error status indicator may then be subsequently set through the read and write-back process, even though the memory addresses overwritten through the read and write-back process now store corrected memory data without a memory error. In some examples, the error tracking circuitry 110 receives an instruction from the host memory controller to clear the error status indicator, to which the error tracking circuitry 110 may respond accordingly.

Figure 5:
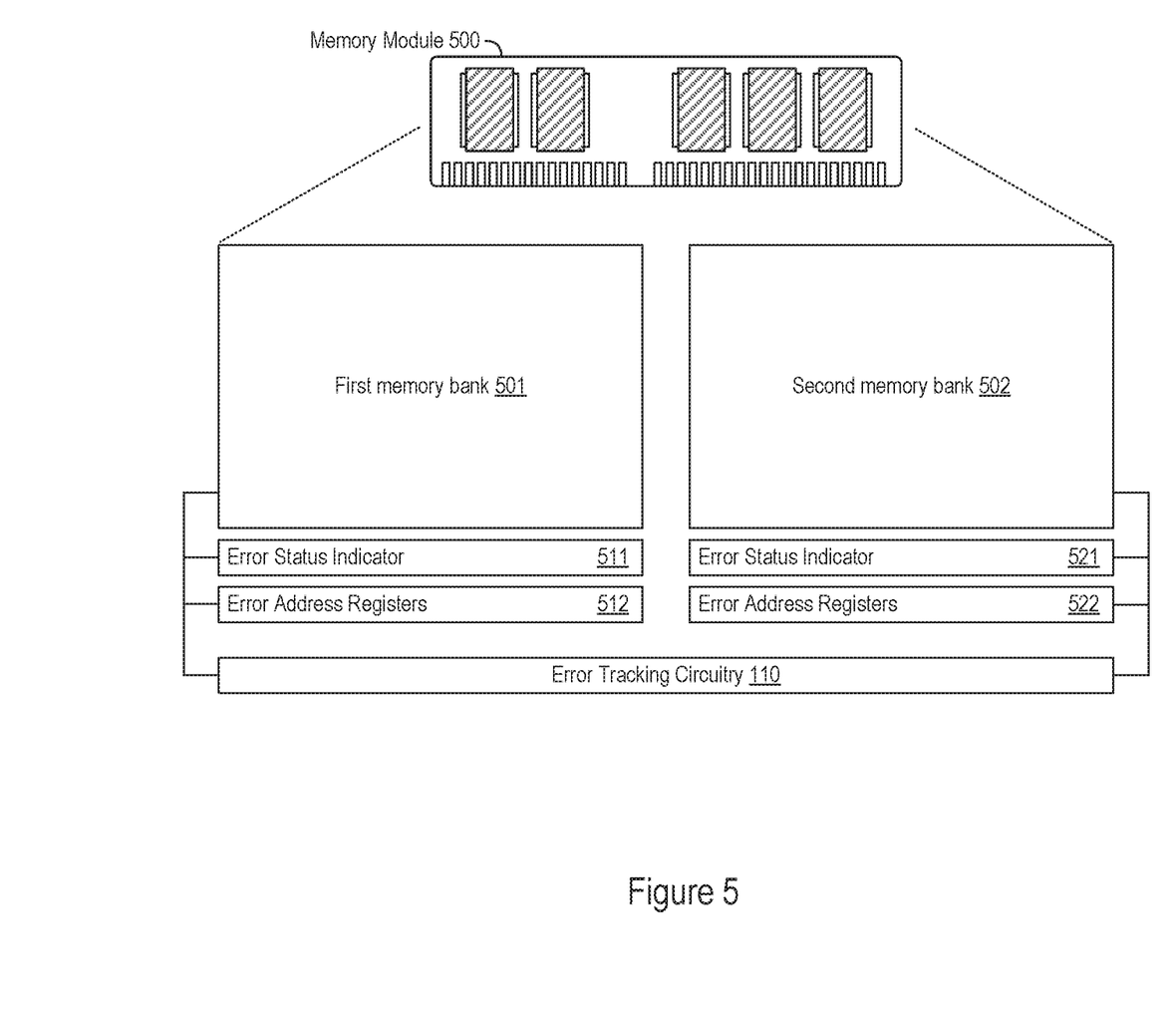
FIG. 5 shows an example of a memory module that supports error tracking for multiple memory banks.

The error tracking circuitry 110 may separately track memory errors for different portions of a memory module, one illustration of which is shown through FIG. 5. FIG. 5 shows an example of a memory module 500 that supports error tracking for multiple memory banks. In the example shown in FIG. 5, the memory module 500 includes multiple memory banks to store memory data, particularly the first memory bank 501 and the second memory bank 502. While two memory banks are illustrated in FIG. 5, the memory module 500 may include any number of memory banks or any number of delineated memory sections through which the error tracking circuitry 110 may separately support error tracking.

A memory module may include any number of memory portions that the error tracking circuitry 110 separately supports error tracking for. Thus, a memory module may implement multiple corresponding error status indicators and error address registers for the multiple memory portions. In FIG. 5, the memory module 500 includes an error status indicator 511 and error address registers 512 assigned to the first memory bank 501 as well as an error status indicator 521 and error address registers 522 assigned to the second memory bank 502. The memory module 500 also includes error tracking circuitry 110. The error tracking circuitry 110 may be separately implemented for the first memory bank 501 and the second memory bank 502, for example. In that regard, separately tracked memory portions of the memory module 100 may have corresponding, separate instances of the error tracking circuitry 110.

The error tracking circuitry 110 may separately track memory errors for the first memory bank 501 and the second memory bank 502. For instance, the error tracking circuitry 110 may receive a memory read request for memory data stored in the first memory bank 501 and at a particular memory address located within the first memory bank 501. Upon detecting an error for the memory data stored at the particular memory address located within the first memory bank 501, the error tracking circuitry 110 may set the error status indicator 511 for the first memory bank 501, but not the error status indicator 521 for the second memory bank 502 (and not other error status indicators the memory module 500 may implement for other memory portions, if any). Likewise, the error tracking circuitry 110 may track the particular memory address storing errant memory in the first memory bank 501 through one of the error address registers 512 for the first memory bank 501, but not other error address registers for other memory portions such as the error address registers 522 for the second memory bank 502. Thus, the error tracking circuitry 110 may separately track memory errors for different portions of a memory module.

The error tracking circuitry 110 may separately provide tracked error data to a host system for various portions of the memory module as well. In some examples, the error tracking circuitry 110 receives distinct error inquiries for the first memory bank 501 and second memory bank 502 respectively. In response to receiving an error inquiry for a particular memory bank, the error tracking circuitry 110 may determine whether the corresponding error status indicator for the particular memory bank is set and send the contents of the corresponding error address registers for the particular memory bank accordingly. By distinctly tracking memory errors arising from different portions of a memory module, the error tracking circuitry 110 may provide more targeted insight into the nature and frequency of memory errors for the different memory portions. Doing so may allow a host system to pinpoint memory error issues (e.g., hardware failures) to particular portions of the memory module and respond accordingly.

Figure 6:
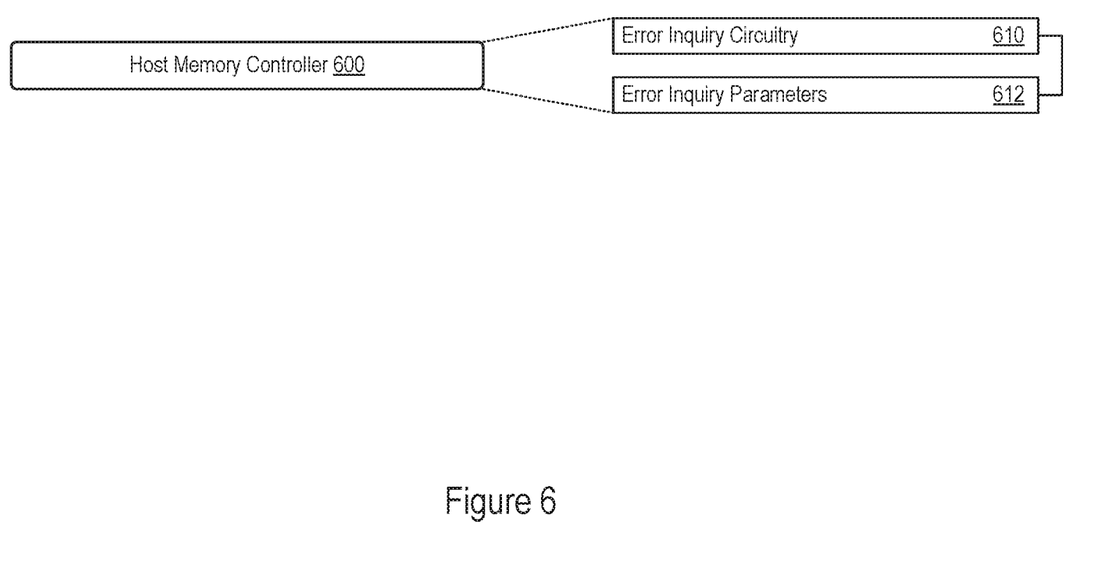
FIG. 6 shows an example of a host memory controller that supports error tracking for a memory module.

FIG. 6 shows an example of a host memory controller 600 that supports error tracking for a memory module. The host memory controller 600 may serve as the element of a host system that links and interfaces to a memory module. The host memory controller 600 may be implemented through circuitry of the host system, for example as an application specific integrated circuit, field programmable gate array, hardware logic, executable instructions stored on a machine-readable medium, or in various other forms. In some examples, the host memory controller 600 is implemented as part of (e.g., circuitry of) a processor in the host system.

The host memory controller 600 may retrieve error tracking data from a memory module, including memory addresses of errant memory data stored on the memory module. In that regard, the host memory controller 600 may include error inquiry circuitry 610 and error inquiry parameters 612. The error inquiry circuitry 610 may probe a memory module linked to the host memory controller 600 to collect tracked error data, correct errant memory data stored on the memory module, or both. In particular, the error inquiry circuitry 610 may send an error inquiry to the memory module to poll whether the memory module has detected a memory error for memory data stored on the memory module.

An error inquiry sent by the host memory controller may prompt a response from the memory module, such as a response message indicating whether the memory module has detected a memory error not. If so, the host memory controller may send an explicitly request error address register contents from the memory module, such as through sending an error address register read request to the memory module. In some examples, the memory module automatically provides memory addresses stored on the error address registers when a response message from the memory module indicates a memory error has been detected.

The error inquiry circuitry 610 may send error inquiries to the memory module according to the error inquiry parameters 612. The error inquiry parameters 612 may specify conditions, periodicity, requirements, syntax, formatting, or any other parameters through which the error inquiry circuitry 610 sends an error inquiry to the memory module, any of which may be configurable by a system administrator, user, or other control entity. In some examples, the error inquiry circuitry 610 periodically sends an error inquiry to the memory module, thus allowing the error inquiry circuitry 610 to periodically determine whether the memory module has detected memory errors and collect the corresponding memory addresses identifying locations of errant memory data stored on the memory module. The periodicity may be configurable through the error inquiry parameters 612 according to particular system resource requirements, to reduce performance impact, or flexibly according to any other factors.

In some examples, the error inquiry circuitry 610 sends an error inquiry to the memory module on an aperiodic basis. For example, the error inquiry circuitry 610 may send an error inquiry to the memory module in response to a particular system event, when system resource usage decreases below a usage threshold, or according to any other inquiry criteria set forth by the error inquiry parameters 612. The error inquiry parameters 612 may specify the sending of error inquiries according to a combination of periodic and aperiodic parameters.

The error inquiry circuitry 610 may separately poll different portions of a memory module, such as by sending distinct error inquiries to different memory portions of the memory module (e.g., different memory banks). In some examples, the error inquiry circuitry 610 maintains separate error inquiry parameters 612 for the different memory portions of the memory module. An error inquiry generated and sent by the error inquiry circuitry 610 may specify a particular memory bank or portion that the error inquiry is directed to, which error tracking circuitry 110 on the memory module may interpret and respond accordingly to.

Through polling the memory module with an error inquiry, the error inquiry circuitry 610 may support correction of memory errors present in the memory module. The error inquiry circuitry 610 may provide corrected data to a memory module to overwrite errant memory data stored at particular memory addresses of the memory module which were tracked by the error tracking circuitry 110. The error inquiry circuitry 610 may provide corrected memory data to the memory module that the memory module itself provides to the host memory controller, as described above with respect to a read and write-back process. That is, the error inquiry circuitry 610 may send a memory read request to the memory module for a particular memory address storing errant memory data.

The response from the memory module may include corrected memory data corrected in-flight, and the error inquiry circuitry 610 may then write back the corrected memory data the particular memory address, thus overwriting the errant memory data stored at the particular memory address. By correcting errant memory data stored on the memory module, the error inquiry circuitry 610 may prevent the accumulation of memory errors in the memory module, which may result in increased data accuracy for the host system and reduced system errors caused by such memory errors. The error inquiry circuitry 610 may instruct the memory module to clear an error status indicator of the memory module, e.g., after writing back corrected memory data to the memory module.

Through error inquiries sent to the memory module, the error inquiry circuitry 610 may also determine the nature and frequency of memory errors occurring on the memory module. For example, the error inquiry circuitry 610 may track the frequency that an error inquiry response from the memory module indicates a detected memory error (e.g., detected since the previous error inquiry). Such a determination may be made by the memory module and host memory controller through the frequency that an error status indicator of the memory module is set when responding to periodic error inquiries from the host memory controller, e.g., the frequency at which the memory module responds with at least one memory address storing errant memory data.

Regarding the nature of memory errors, the error inquiry circuitry 610 may track the particular memory addresses, memory banks, or other portions of the memory module at which memory errors occur. Repeated errors at a particular memory address or memory bank may indicate a hardware failure, for example, and the host system may respond accordingly. Also, error tracking features provided by the memory module and the host memory module may allow the host system to predict possible system failures for a memory module providing on-module error correction, for example through analysis of the number and location of detected memory errors on the memory module.

Figure 7:
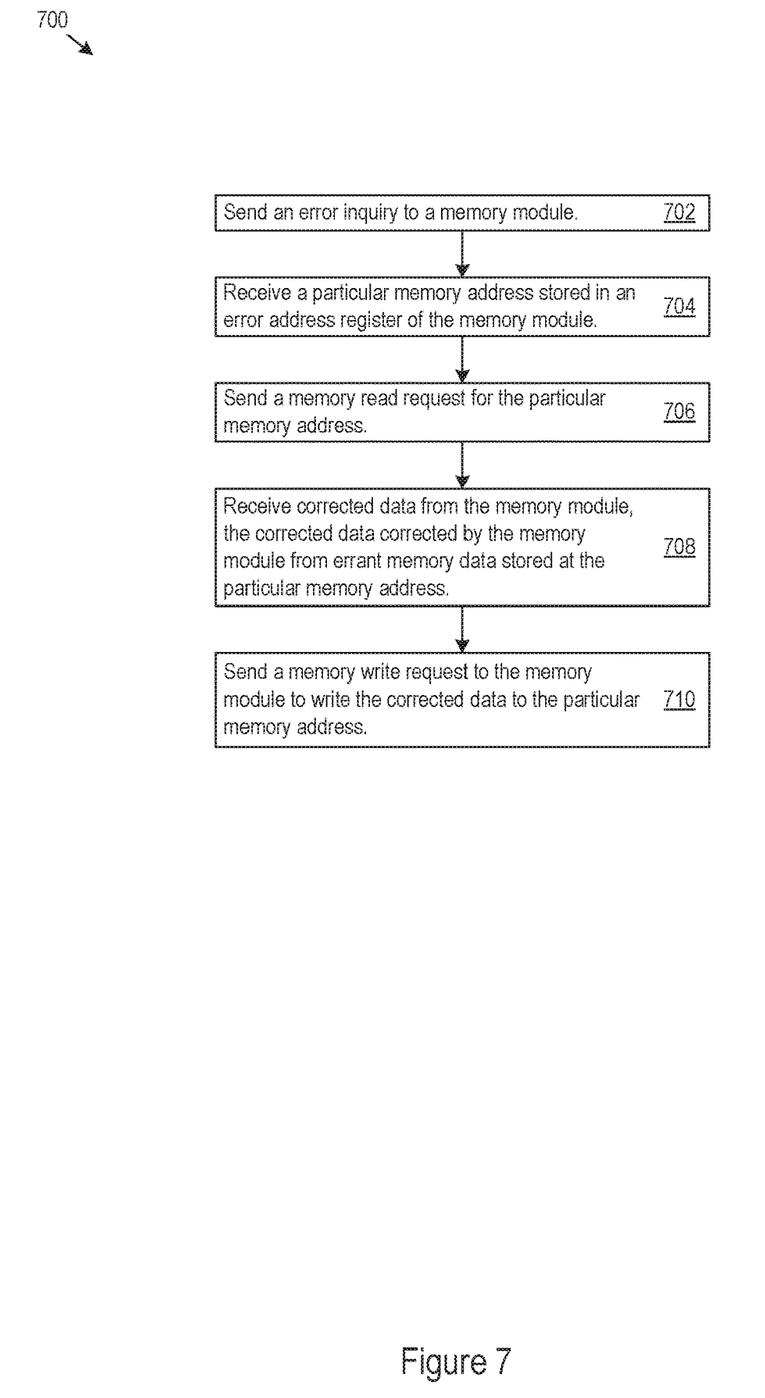
FIG. 7 shows an example of logic that the host memory controller may implement to support error tracking.

FIG. 7 shows an example of logic 700 that a host memory controller may implement to support error tracking. For example, a host memory controller may implement the logic 700 through error inquiry circuitry 610. The error inquiry circuitry 610 may perform or execute the logic 700 as a method to support error tracking for a memory module.

The error inquiry circuitry 610 may send an error inquiry to a memory module (702). The error inquiry circuitry 610 may send the error inquiry to the memory module without impacting memory system performance, for example by sending the error inquiry through an out-of-band channel communication link between the memory module and host memory controller.

In some examples, the error inquiry circuitry 610 periodically sends the error inquiry to the memory module at a periodicity set by an error inquiry parameter 612. The periodicity at which the error inquiry circuitry 610 polls the memory module with error inquiries may be configurable. For example, the error inquiry circuitry 610 may adjust the periodicity of the error inquiry to account for a characteristic of a host system implementing the host memory controller. The error tracking circuitry 110 may likewise adjust the error inquiry periodicity to reduce performance impact and power consumption of a host system by increasing the time interval between error inquiries to the memory module. In some examples, the error tracking circuitry 110 may disable error inquiries to the memory module, such as when a power source for the host system reaches a threshold level (e.g., less than 5% of power remaining).

As a response to the error inquiry, the error inquiry circuitry 610 may receive from the memory module a particular memory address stored in an error address register of the memory module (704). The error inquiry circuitry 610 may receive any number of memory addresses from the memory module, depending on the number of memory errors detected by the memory module.

The error inquiry circuitry 610 may support correction of detected memory errors on the memory module. The error inquiry circuitry 610 may, for example, send a memory read request for the particular memory address received from the error address register of the memory module (706). As the memory module may perform on-module error correction of memory data, the error inquiry circuitry 610 may receive corrected data from the memory module, the corrected data corrected by the memory module from errant memory data stored at the particular memory address (708). Thus, the memory module itself may provide corrected data to the error inquiry circuitry 610 that the error inquiry circuitry 610 may provide back to the memory module. The error inquiry circuitry 610 may send a memory write request to the memory module to write the corrected data (received from the memory module) to the particular memory address (710). Doing so may thus correct the errant memory data stored at the particular memory address of the memory module with the corrected data.

The error inquiry circuitry 610 may read and write-back corrected memory data specifically for the memory addresses provided by the memory module in response to the error inquiry. As the error inquiry circuitry 610 receives particular memory addresses determined to store errant memory data, the error inquiry circuitry 610 may write-back corrected memory data to these particular memory address without having to perform read and write-backs for memory addresses without errant memory data. Thus, in some examples, the error inquiry circuitry 610 writes back corrected data only to memory addresses storing errant memory data. Compared to performing a read and write-back across the entire memory module to scrub errant memory data, the error inquiry circuitry 610 may correct errant memory data in the memory module with increased efficiency.

Figure 8:
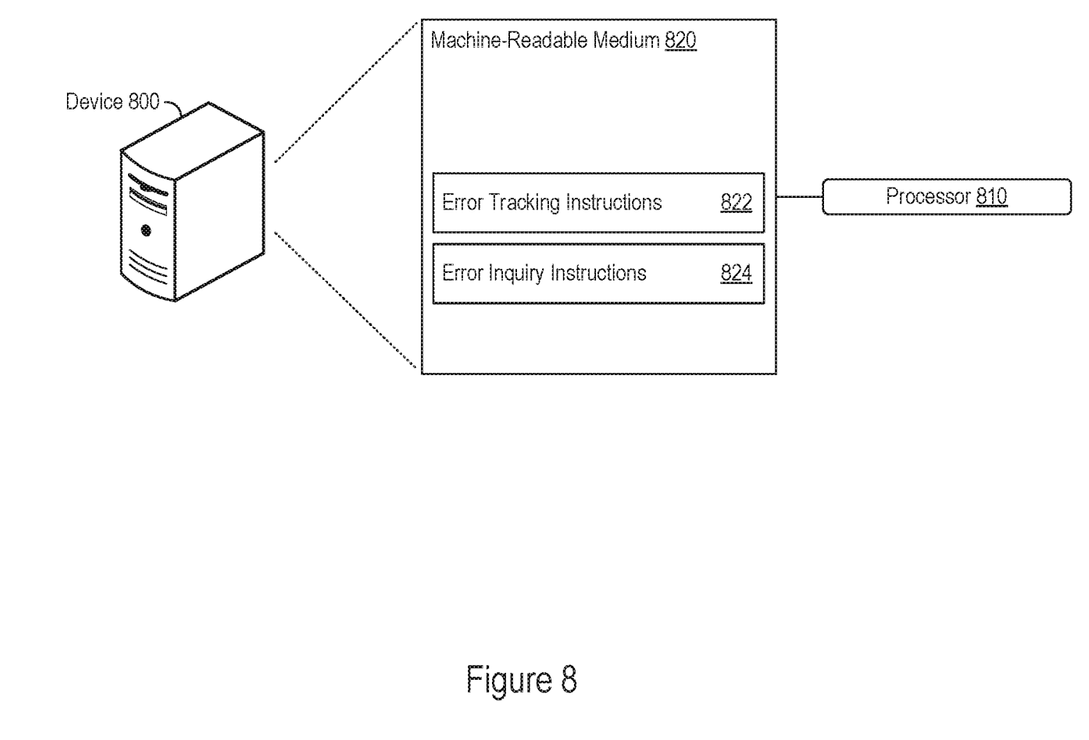
FIG. 8 shows an example of a device that supports error tracking.

FIG. 8 shows an example of a device 800 that supports error tracking for a memory module. The device 800 may include a processor 810. The processor 810 may include a central processing unit (CPU), microprocessor, and/or any hardware device suitable for executing instructions stored on a machine-readable medium.

The device 800 may include a machine-readable medium 820. The machine-readable medium 820 may be any electronic, magnetic, optical, or other physical storage device that stores executable instructions, such as the error tracking instructions 822 and error inquiry instructions 824 shown in FIG. 8. Thus, the machine-readable medium 820 may be, for example, Random Access Memory (RAM), an Electrically-Erasable Programmable Read-Only Memory (EEPROM), a storage drive, an optical disk, and the like.

The device 800 may execute instructions stored on the machine-readable medium 820 through the processor 810. Executing the instructions may cause the device 800 to perform any combination of the features described herein, including features with respect to the error tracking circuitry 110 and the error inquiry circuitry 610. As one illustration, executing the error inquiry instructions 824 may cause the device 800 to operate according to the features described herein with respect to the error inquiry circuitry 610, such as polling a memory module with an error inquiry, receiving a particular memory address from the memory module indicating where errant memory data is stored on the memory module, and providing corrected data to the memory module to overwrite at the particular memory address. As another illustration, executing the error tracking instructions 822 may cause the device 800 to operate according to any of the features of the error tracking circuitry 110 described herein.

The methods, devices, systems, and logic described above, including the error tracking circuitry 110 and the error inquiry circuitry 610, may be implemented in many different ways in many different combinations of hardware, executable instructions stored on a machine-readable medium, or combinations of both. For example, all or parts of the error tracking circuitry 110 or the error inquiry circuitry 610 may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. The processing capability of the systems, devices, and circuitry described herein, including the error tracking circuitry 110 and the error inquiry circuitry 610, may be distributed among multiple system components, such as among multiple processors, memory controllers, memories, and logic, possibly including multiple distributed processing systems.

All or part of the circuitry, systems, devices, and logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

Some example implementations have been described. Other implementations are possible.

The invention claimed is:

1. A method for error tracking comprising:
through a memory module:
receiving a memory read request, from a host memory controller external to the memory module, for memory data stored at a particular memory address for the memory module;
retrieving the memory data from the particular memory address;
detecting that the memory data includes an error and in response, without overwriting the memory data stored at the particular memory address:
causing the particular memory address to be stored in an error address register of the memory module, wherein the memory module comprises a plurality of error address registers storing addresses of errant memory data;
setting an error status indicator to indicate that the error is detected;
in response to receiving an error inquiry from the external host memory controller and the error status indicator being set, sending contents of the error address registers to the external host memory controller to allow the external host memory controller to correct the errant memory data stored on the memory module by performing a read and write-back operation based on the contents of the error address registers;
correcting, by the memory module, the errant memory data to obtain corrected memory data; and
sending, by the memory module, the corrected memory data to the external host memory controller to allow the external host memory controller to correct the errant memory data using the corrected memory data sent by the memory module.

2. The method of claim 1, further comprising periodically receiving the error inquiry from the external host memory controller.

3. The method of claim 1, wherein causing the particular memory address to be stored comprises storing the particular memory address in the error address register when the particular memory address is not already stored in one of the plurality of error address registers.

4. The method of claim 1, further comprising:
after sending the contents of the error address registers, removing the addresses of the errant memory data from the memory address registers; and
after removing the memory addresses from the error address registers, unsetting the error status indicator.

5. The method of claim 1, further comprising:
maintaining, for the error address register, a counter; and
incrementing the counter when an error is detected for the particular memory address stored in the error address register.

6. A method for error tracking comprising:
through a host memory controller external to a memory module:
sending an error inquiry to the memory module, wherein the memory module comprises one or more error address registers storing addresses of errant memory data and an error indicator indicating error status of the memory module;
receiving, from the memory module in response to the error inquiry and the error status indicator being set, a response message comprising contents of the error address registers; and
correcting the errant memory data by performing a read and write-back operation based on the contents of the error address registers;
wherein correcting the errant memory data comprises:
receiving, by the host memory controller, corrected memory data from the memory module; and
correcting the errant memory data using the corrected memory data received from the memory module.

7. The method of claim 6, further comprising periodically sending the error inquiry to the memory module at a periodicity set by an error inquiry parameter.

8. The method of claim 7, further comprising adjusting the periodicity for the error inquiry to account for a characteristic of a host system implementing the host memory controller external to the memory module.

\* \* \* \* \*